United States Patent
Klijn

(10) Patent No.: US 9,581,652 B2
(45) Date of Patent: *Feb. 28, 2017

(54) BATTERY INSULATION RESISTANCE MEASUREMENT METHODS, INSULATION RESISTANCE MEASUREMENT METHODS, INSULATION RESISTANCE DETERMINATION APPARATUSES, AND ARTICLES OF MANUFACTURE

(71) Applicant: Valence Technology, Inc., Las Vegas, NV (US)

(72) Inventor: Aaron Klijn, Austin, TX (US)

(73) Assignee: Valence Technology, Inc., Las Vegas, NV (US)

( * ) Notice: Subject to any disclaimer, the term of this patent is extended or adjusted under 35 U.S.C. 154(b) by 641 days.

This patent is subject to a terminal disclaimer.

(21) Appl. No.: 13/834,681

(22) Filed: Mar. 15, 2013

(65) Prior Publication Data

US 2013/0214788 A1 Aug. 22, 2013

Related U.S. Application Data

(63) Continuation of application No. 12/622,134, filed on Nov. 19, 2009, now Pat. No. 8,421,467.

(51) Int. Cl.
   *G01N 27/416* (2006.01)
   *G01R 31/36* (2006.01)
   *G01R 27/02* (2006.01)
   *G01R 27/18* (2006.01)

(52) U.S. Cl.
   CPC ......... *G01R 31/362* (2013.01); *G01R 27/025* (2013.01); *G01R 27/18* (2013.01); *G01R 31/3606* (2013.01)

(58) Field of Classification Search
   CPC .......... G01R 19/16542; G01R 31/3648; G01R 31/3658; G01R 31/3682; Y02E 60/12
   USPC ....................................................... 324/430
   See application file for complete search history.

(56) References Cited

U.S. PATENT DOCUMENTS

| | | | |
|---|---|---|---|
| 5,352,968 A * | 10/1994 | Reni et al. | 320/136 |
| 5,909,099 A * | 6/1999 | Watanabe et al. | 320/108 |
| 6,005,371 A | 12/1999 | Umetsu | |
| 6,392,908 B2 | 5/2002 | Miyazaki et al. | |
| 6,919,706 B2 | 7/2005 | Furukawa | |
| 7,009,401 B2 * | 3/2006 | Kinoshita et al. | 324/430 |
| 7,862,944 B2 | 1/2011 | Hinz et al. | |
| RE44,455 E | 8/2013 | Muller | |
| 2002/0110008 A1 * | 8/2002 | Miyazaki et al. | 363/56.01 |
| 2002/0121901 A1 | 9/2002 | Hoffman | |
| 2003/0025481 A1 * | 2/2003 | Bertness | 320/155 |
| 2003/0042909 A1 | 3/2003 | Yamamoto et al. | |
| 2004/0021712 A1 * | 2/2004 | Yamamoto et al. | 347/7 |
| 2004/0041569 A1 | 3/2004 | Furukawa | |
| 2004/0189330 A1 * | 9/2004 | Herb | G01R 27/18 324/691 |
| 2005/0264264 A1 | 12/2005 | Yano et al. | |
| 2007/0013382 A1 | 1/2007 | Hinz et al. | |
| 2007/0120534 A1 * | 5/2007 | Arai | 320/133 |
| 2007/0210805 A1 | 9/2007 | Kawamura | |
| 2007/0285057 A1 * | 12/2007 | Yano | B60L 3/0046 320/116 |
| 2007/0285102 A1 | 12/2007 | Muller | |
| 2008/0054907 A1 | 3/2008 | Kudo et al. | |
| 2008/0233469 A1 * | 9/2008 | Drozdz et al. | 429/61 |
| 2009/0051365 A1 | 2/2009 | Bertness | |
| 2009/0108850 A1 | 4/2009 | Yamagami et al. | |
| 2009/0189548 A1 | 7/2009 | Hoffman et al. | |
| 2010/0201317 A1 * | 8/2010 | Shiu et al. | 320/116 |
| 2010/0219837 A1 * | 9/2010 | Austerschulte | 324/429 |
| 2012/0016613 A1 | 1/2012 | Yang et al. | |

FOREIGN PATENT DOCUMENTS

| | | |
|---|---|---|
| DE | 10304234 | 8/2004 |
| EP | 1391962 | 2/2004 |
| EP | 1586910 | 10/2005 |
| EP | 1857825 | 11/2007 |
| EP | 10832059 | 4/2015 |
| JP | 54-079688 | 6/1979 |
| JP | 05-273287 | 10/1993 |
| JP | 06-308185 | 11/1994 |
| JP | 08-160082 | 6/1996 |
| JP | 08/160082 | 6/1996 |
| JP | 2003-066090 | 3/2003 |
| JP | 2007-240300 | 9/2007 |

(Continued)

OTHER PUBLICATIONS

Annex 4, "Measurement of the Insulation Resistance using the Traction Battery", E/ECE/324, E/ECE/TRANS/505, Rev. 2/Add. 99, Regulation No. 100, Apr. 11, 1997, pp. 22-23.

*Primary Examiner* — Arun Williams
(74) *Attorney, Agent, or Firm* — Wells St. John P.S.

(57) ABSTRACT

Battery insulation resistance measurement methods, insulation resistance measurement methods, insulation resistance determination apparatuses, and articles of manufacture are described. According to one aspect, a battery insulation resistance measurement method includes determining a voltage of a battery, determining a voltage of a first terminal of the battery with respect to a ground reference, determining a voltage of a second terminal of the battery with respect to the ground reference, and using the voltages of the battery, the first terminal and the second terminal, determining an insulation resistance of the battery with respect to the ground reference.

18 Claims, 5 Drawing Sheets

(56) References Cited

FOREIGN PATENT DOCUMENTS

| JP | 2007-240426 | 9/2007 |
|---|---|---|
| JP | 2007-327856 | 12/2007 |
| KR | 10-2010-0105962 | 10/2010 |
| WO | WO PCT/US2010/056861 | 7/2011 |
| WO | WO PCT/US2010/056861 | 5/2012 |

* cited by examiner

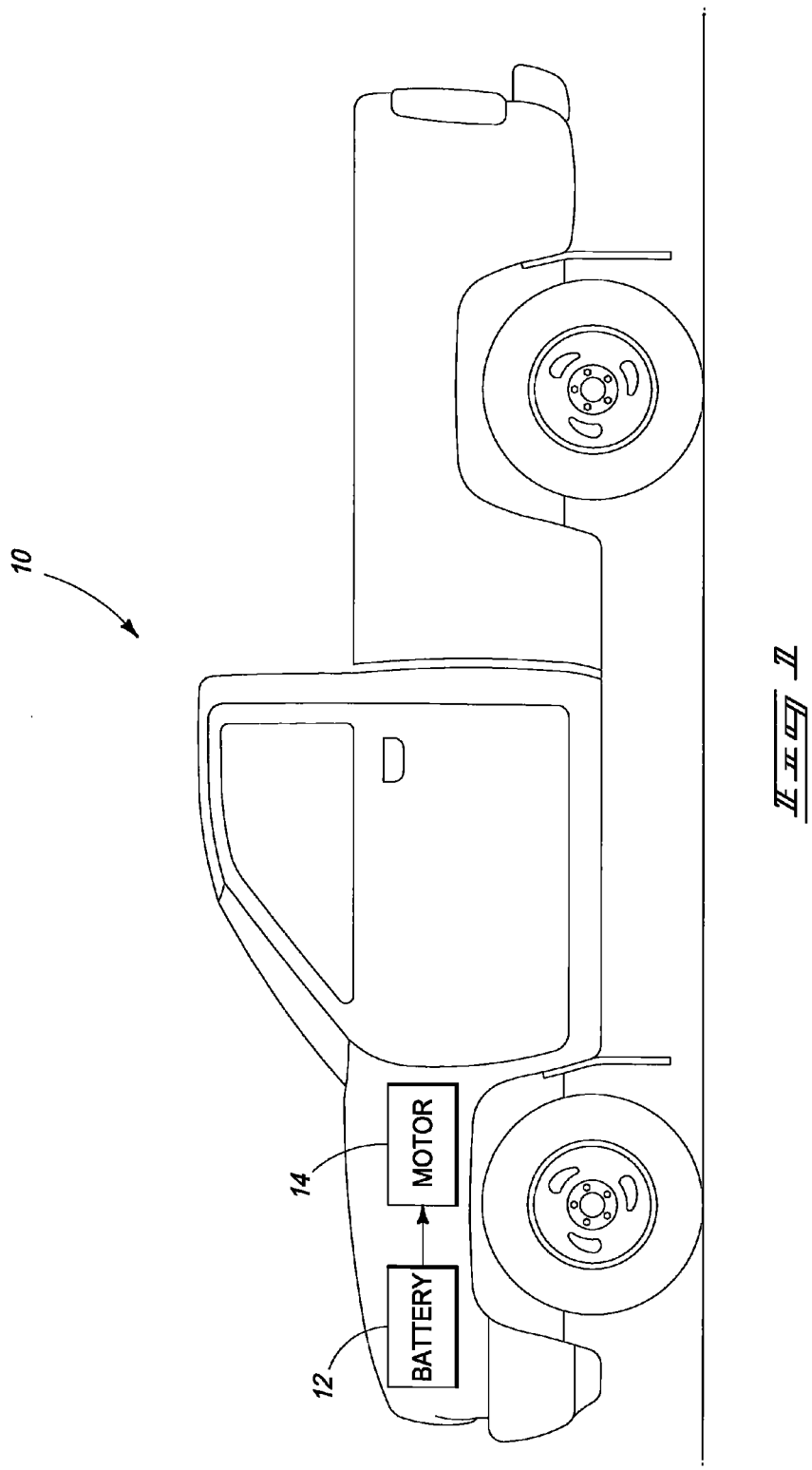

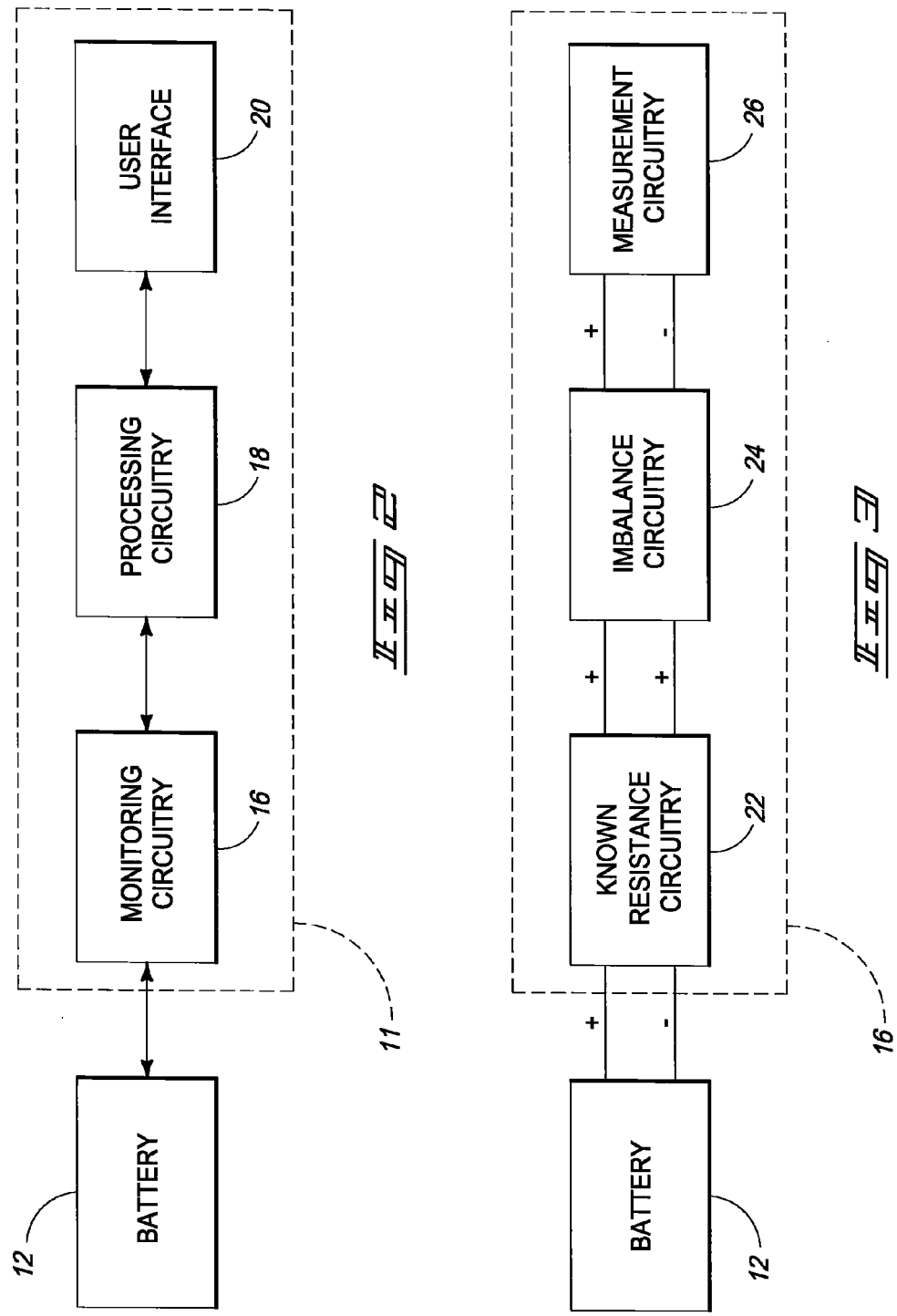

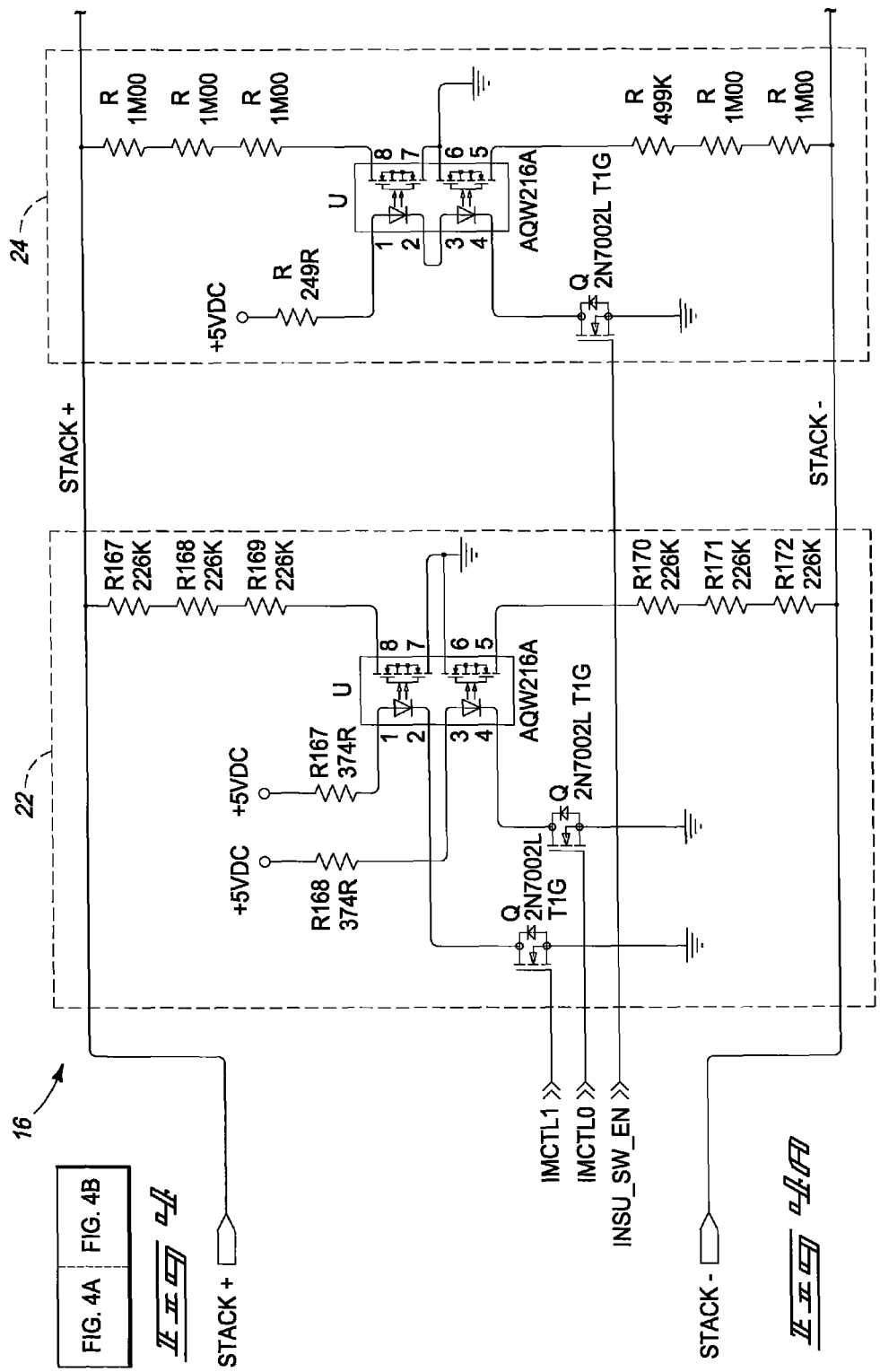

BATTERY INSULATION RESISTANCE MEASUREMENT METHODS, INSULATION RESISTANCE MEASUREMENT METHODS, INSULATION RESISTANCE DETERMINATION APPARATUSES, AND ARTICLES OF MANUFACTURE

RELATED PATENT DATA

This application is a continuation of U.S. patent application Ser. No. 12/622,134, which was filed on Nov. 19, 2009 and which is incorporated by reference herein.

TECHNICAL FIELD

This disclosure relates to battery insulation resistance measurement methods, insulation resistance measurement methods, insulation resistance determination apparatuses, and articles of manufacture.

BACKGROUND OF THE DISCLOSURE

Electrically powered vehicles including battery powered and hybrid vehicles have recently increased in popularity due to numerous factors including increases in costs in fuel as well as stricter regulations of vehicle emissions. Some electrical vehicles may utilize substantial amounts of electrical energy which may be dangerous to occupants of the vehicles. Accordingly, methods have been provided to determine an insulation resistance of the batteries of the vehicle with respect to the chassis.

One conventional method for measuring insulation resistance is defined by ECE 324 Addendum 99 regulation No 100, Annex 4. Such method specifies that the battery is to be fully charged for the test and the voltmeter utilized measures voltages in DC values and has an internal resistance of greater than 10 MOhms.

This method also provides that the measurement will be performed in two steps where the voltages from the positive terminal (V'1) and the negative terminal (V1) of the battery are each measured with respect to chassis ground of the vehicle in a first step. The method provides that the measurements are assumed to be absolute values of the measurement since V'1 is always positive with respect to the chassis and V1 is always negative with respect to the chassis.

In a second step, a resistance (Ro) of 500 Ohms/V is provided from the negative terminal to chassis ground if V1>V'1 and the voltage of the negative terminal is measured with respect to the chassis. Alternatively, the resistance is provided from the positive terminal to ground and the voltage is measured from the positive terminal to the chassis ground if V'1>V1.

The insulation resistance is calculated by Ri=(V1−V2)/V2×Ro if V1 is greater than V'1. Otherwise the insulation resistance is calculated by Ri=(V'1−V2)/V2×Ro.

Modeling of this method shows a 3.372% error when test insulation component resistances of 100 kOhms and 900 kOhms are respectively coupled from the chassis to the positive and negative terminals and used for a 600 V battery and R0 equal to the proper 500 Ω/V of 300 kOhms. Furthermore, if R0 is increased above 500 Ohms/V, the error of this method increases. For example, if an R0 of 480 kOhms is utilized the error is 4.929%. Finally, use of a voltmeter having less internal resistance than 10 MOhms can also significantly increase the error. Inherent inaccuracies in the method and sensitivity to impedance values stipulated in the method are believed to be sources of some of the error.

At least some aspects of the disclosure provide apparatus and methods for measuring insulation resistances with improved accuracy and with less constraints.

BRIEF DESCRIPTION OF THE DRAWINGS

Exemplary embodiments of the disclosure are described below with reference to the following accompanying drawings.

FIG. 1 is an illustrative representation of an electrically powered vehicle according to one embodiment.

FIG. 2 is a functional block diagram of an insulation resistance measurement apparatus according to one embodiment.

FIG. 3 is a functional block diagram of monitoring circuitry according to one embodiment.

FIG. 4 is a map illustrating how FIGS. 4A and 4B are to be assembled. Once assembled, FIGS. 4A and 4B are a schematic illustration of monitoring circuitry according to one embodiment.

DETAILED DESCRIPTION OF THE DISCLOSURE

Figure 4B:
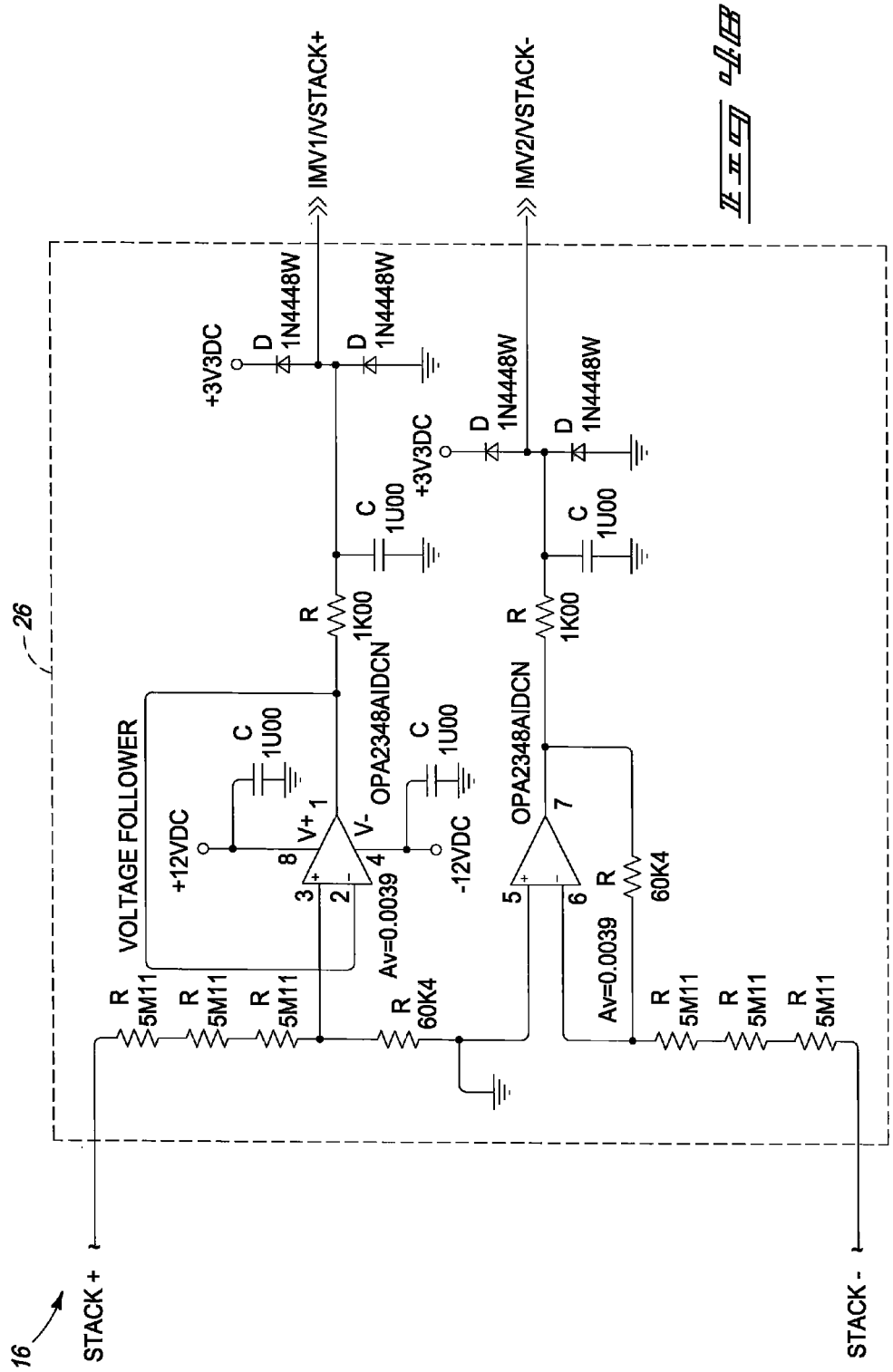

This disclosure of the invention is submitted in furtherance of the constitutional purposes of the U.S. Patent Laws "to promote the progress of science and useful arts" (Article 1, Section 8).

As described below, some illustrative embodiments of the disclosure provide apparatus and methods of determining insulation resistance with respect to a ground reference. In some of the embodiments, the apparatus and methods may be used to determine the insulation resistance of a battery with respect to a ground reference. In one example described below, insulation resistances may be determined for each of the positive terminal and negative terminal of the battery with respect to the ground reference.

The battery described below with respect to reference 12 may include a single battery, or alternatively refer to a battery stack or system which includes a plurality of batteries which may be provided in series and/or parallel arrangements between positive and negative terminals of the battery stack, which may be referred to as positive and negative stack or system terminals. Positive and negative terminals of the battery 12 may refer to the stack terminals in embodiments where battery 12 includes a plurality of batteries of a battery stack or system. In battery stack arrangements, the positive and negative stack terminals may be terminals of different batteries of the battery system. Some embodiments described below determine insulation resistances of the battery stack and each of the stack terminals with respect to a ground reference.

In one implementation described below, the battery may be implemented within a vehicle and the insulation resistances of the terminals and/or the battery itself may be determined with respect to a ground reference of the vehicle (e.g., chassis ground although other ground references may be used). Example vehicles include automobiles, marine vehicles or other vehicles which may use a battery. In addition, some embodiments of the disclosure may be used to determine information regarding insulation resistances of batteries which are implemented in other applications with other types of loads apart from vehicles. Other embodiments of the disclosure are also described below.

Referring to FIG. 1, an example of an electrically powered vehicle 10 implemented as a truck is shown. The electrically powered vehicle 10 includes a battery 12 and a motor 14. Battery 12 may be a rechargeable traction battery, such as a Lithium-ion battery, with sufficient capacities to power motor 14 and/or other loads in one embodiment. As mentioned above, battery 12 may refer to one battery or a plurality of batteries (i.e., of a battery stack). In one example, battery 12 may comprise a plurality of cells arranged to provide 600 VDC. Motor 14 is an electrical motor or hybrid motor in some embodiments which consumes electrical energy to propel vehicle 10.

Referring to FIG. 2, one embodiment of an insulation resistance measurement apparatus 11 is shown. In the depicted embodiment, apparatus 11 includes monitoring circuitry 16, processing circuitry 18, and a user interface 20. Other embodiments are possible including more, fewer and/or alternative components.

Insulation resistance measurement apparatus 11 may be implemented within vehicle 10 in one embodiment and circuitry 16, 18 and user interface, 20 may be components of vehicle 10. In one more specific example, insulation resistance measurement apparatus 11 is configured to measure insulation resistances of the battery 12 including insulation resistances of the battery 12 and/or individual ones of the positive and negative terminals of the battery 12 (i.e., positive and negative terminals of battery 12 comprising a single battery or the positive and negative stack terminals of battery 12 implemented as a battery stack or system), which may be useful over only knowing the equivalent insulation resistance of the battery 12 itself. In an embodiment where apparatus 11 is implemented within vehicle 10, the apparatus 11 may determine the insulation resistances of the battery 12 with respect to a ground reference, such as the chassis ground of vehicle 10. Apparatus 11 may be used in different implementations and may be used to measure insulation resistances of other circuitry and/or with respect to other ground references in other embodiments.

Monitoring circuitry 16 is configured to couple with and monitor a circuit where the insulation resistance is to be measured in one embodiment. In the depicted arrangement, monitoring circuitry 16 is coupled with and configured to monitor battery 12. In addition, the monitoring circuitry 16 may also be coupled with a ground reference, such as the chassis ground of vehicle 10. One embodiment of monitoring circuitry 16 is described below with respect to FIGS. 3 and 4.

In one embodiment, processing circuitry 18 is arranged to process data, control data access and storage, issue commands, and control other desired operations. For example, processing circuitry 18 may access data (e.g., voltages) from measurement circuitry 26 and may control operations of known resistance circuitry 22 and imbalance circuitry 24 discussed below with respect to FIGS. 3 and 5. Processing circuitry 18 may use the accessed data to determine insulation resistances of the battery 12 and/or the terminals of the battery 12 with respect to a ground reference. Processing circuitry 18 may also convey insulation resistance information to users and/or take other appropriate actions based upon the determined insulation resistances. In one specific example, the processing circuitry 18 may issue a human-perceptible alarm and/or implement a shut down command if the insulation resistance falls below one or more thresholds (e.g., 500 Ohms/V) which may indicate a potentially unsafe arrangement where the battery is not sufficiently insulated, the performance of the vehicle 10 or battery 12 may be degraded due to insufficient insulation, and/or insulation material (e.g., body of vehicle) may be subjected to corrosion.

Processing circuitry 18 may comprise circuitry configured to implement desired programming provided by appropriate media in at least one embodiment. For example, the processing circuitry 18 may be implemented as one or more of processor(s) and/or other structure configured to execute executable instructions including, for example, software and/or firmware instructions, and/or hardware circuitry. Exemplary embodiments of processing circuitry 18 include hardware logic, PGA, FPGA, ASIC, state machines, and/or other structures alone or in combination with a processor. These examples of processing circuitry 18 are for illustration and other configurations are possible.

In some embodiments, processing circuitry 18 may comprise storage circuitry or access external storage circuitry (not shown) of apparatus 11. The storage circuitry is configured to store programming such as executable code or instructions (e.g., software and/or firmware), electronic data, databases, or other digital information and may include processor-usable media. Processor-usable media may be embodied in any computer program product(s) or article of manufacture(s) which can contain, store, or maintain programming, data and/or digital information for use by or in connection with an instruction execution system including processing circuitry in the exemplary embodiment. For example, exemplary processor-usable media may include any one of physical media such as electronic, magnetic, optical, electromagnetic, infrared or semiconductor media. Some more specific examples of processor-usable media include, but are not limited to, a portable magnetic computer diskette, such as a floppy diskette, zip disk, hard drive, random access memory, read only memory, flash memory, cache memory, and/or other configurations capable of storing programming, data, or other digital information.

At least some embodiments or aspects described herein may be implemented using programming stored within appropriate storage circuitry described above and configured to control appropriate processing circuitry 18. For example, programming may be provided via appropriate media including, for example, embodied within articles of manufacture.

User interface 20 is configured to interact with a user including conveying data to a user (e.g., displaying data for observation by the user, audibly communicating data to a user, etc.) as well as receiving inputs from the user (e.g., tactile input, voice instruction, etc.). In one embodiment, user interface 20 may be implemented as a driver information display screen of vehicle 10 and may convey warnings to a user based upon insulation resistance measurements (e.g., warn passengers of vehicle 10 if the insulation resistance falls below one or more safety thresholds) in one embodiment.

Referring to FIG. 3, additional details of one embodiment of monitoring circuitry 16 are described. In the illustrated arrangement, monitoring circuitry 16 includes known resistance circuitry 22, imbalance circuitry 24, and measurement circuitry 26 briefly discussed above. Other embodiments are possible including more, fewer and/or alternative components.

Known resistance circuitry 22 is configured to selectively couple and un-couple a known resistance R0 between terminals of the subject device (e.g., battery 12) being monitored and the chassis ground in one embodiment. For example, under control from processing circuitry 18, known resistance circuitry 22 may selectively couple a known resistance R0 (e.g., 678 kOhms) between the positive terminal of battery 12 and the chassis ground of vehicle 10 and between the negative terminal of battery 12 and the chassis ground of vehicle 10 at different moments in time to determine the insulation resistance of the battery 12.

Imbalance circuitry 24 is configured to selectively couple and un-couple imbalanced resistances with terminals of the subject device being monitored in one embodiment. In the described example where battery 12 of vehicle 10 is being monitored, the imbalance circuitry 24 may couple different resistances between the positive and negative terminals of the battery 12 and the chassis ground. In one embodiment, processing circuitry 18 controls the selective coupling of the imbalanced resistances with the terminals during measurement operations as described in further detail below.

Measurement circuitry 26 is configured to monitor electrical characteristics of the subject device being monitored in one embodiment. For example, the measurement circuitry 26 may condition electrical energy at terminals of the battery 12 being monitored and output the conditioned electrical energy to processing circuitry 18 for access of the electrical characteristics of the battery 12. In one example, processing circuitry 18 is configured to access and monitor voltages at the positive and negative terminals of the battery 12 with respect to chassis ground using measurement circuitry 26 in one embodiment. Measurement circuitry 26 includes operational amplifier voltage dividing resistances of approximately 15.33 MOhms and 15.39 MOhms with respect to the terminals as shown in FIG. 4B for providing conditioned output to processing circuitry 18 in one embodiment. These operational amplifier resistances may also be referred to as voltmeter resistances which scale down and enable voltage measurements with respect to each of the positive and negative terminals and ground.

The disclosure now proceeds to discuss one embodiment of measuring the insulation resistance of battery 12 with respect to chassis ground of vehicle 10. Initially, the processing circuitry 18 determines the voltages at the positive and negative terminals of the battery 12 with respect to chassis ground (i.e., V'1 is the voltage of the positive terminal of the battery 12 with respect to the chassis and V1 is the voltage of the negative terminal of the battery with respect to the chassis). The voltages V'1 and V1 are summed to provide the voltage of the battery 12 (Vbat).

In one embodiment, imbalance circuitry 24 is utilized to couple imbalanced resistances with respective ones of the positive and negative terminals during the measurement of V'1 and V1. In other embodiments, imbalance circuitry 24 may be omitted or otherwise not utilized during the V'1 and V1 measurements.

In one embodiment where imbalance circuitry 24 is utilized, the imbalance circuitry 24 couples imbalanced resistances intermediate the positive and negative terminals and the chassis ground while V'1 and V1 are measured to attempt to ensure that V'1 and V1 are not equal. In one embodiment, a resistance of 3 MOhms is coupled between the positive terminal and chassis and a resistance of 2.5 MOhms is coupled between the negative terminal and chassis. With the forced imbalance, V'1 is higher than V1 if the insulation resistance is balanced. However, V1 can be greater than V'1 if the insulation resistance of the positive terminal is significantly lower than the insulation resistance of the negative terminal.

In one embodiment, the known resistance circuitry 22 is disabled by the processing circuitry 18 during the measurement of voltages V'1 and V1 and the known resistance R0 is not coupled with the terminals. Furthermore, processing circuitry 18 enables the imbalance circuitry 24 to couple the unbalanced resistances with the positive and negative terminals in one embodiment during the measurement of voltages V'1 and V1. Processing circuitry 26 processes the output of measurement circuitry 26 in one embodiment to determine the voltages V'1 and V1.

Following the measurements of V'1 and V1, the processing circuitry 18 disables imbalance circuitry 24 (if present and previously enabled) to uncouple the unbalanced resistances from the positive and negative terminals of the battery 12 in one embodiment. In addition, the processing circuitry 18 controls the known resistance circuitry 22 to couple a known resistance R0 with each of the positive and negative terminals of battery 12 at different moments in time and again measures the voltages at the positive and negative terminals of the battery 12 in one embodiment. In one more specific example, the processing circuitry 18 controls the known resistance circuitry 22 to couple the known resistance R0 with one of the terminals of the battery 12 opposite to the other of the terminals being monitored. More specifically, the known resistance R0 is first coupled with the negative terminal of battery 12 and the chassis ground while measuring the voltage of the positive terminal (Vpos) and thereafter the known resistance R0 is second coupled with the positive terminal of battery 12 and the chassis ground while measuring the voltage of the negative terminal (Vneg).

Accordingly, the processing circuitry 18 has information regarding the voltages of the positive and negative terminals of battery 12 (i.e., V'1 and V1) and battery 12 (i.e., Vbat) without the known resistance R0 as well as voltages of the positive and negative terminals of battery 12 (i.e., Vpos and Vneg) with the known resistance R0. Processing circuitry 18 may utilize these voltages and Kirkoffs's voltage law to determine the insulation resistances for each of the positive and negative terminals of battery 12 and the insulation resistance of the battery 12.

In one embodiment, the processing circuitry 18 may determine the insulation resistance of the positive terminal (Ripos) of battery 12 according to Equation 1 and the insulation resistance of the negative terminal (Rineg) of battery 12 according to Equation 2. These equations are an ideal case in one embodiment which do not account for the operational amplifier resistances.

$$\text{Ripos}=-[R0(V\text{bat}-V\text{neg}-V\text{pos})]/(V\text{bat}-V\text{pos}) \quad \text{Equation 1}$$

$$\text{Rineg}=-[R0(V\text{bat}-V\text{neg}-V\text{pos})]/(V\text{bat}-V\text{neg}) \quad \text{Equation 2}$$

Furthermore, the processing circuitry 18 may provide information regarding the insulation resistance of battery 12. In one embodiment, the processing circuitry 18 may determine the parallel equivalent resistance of the positive and negative terminals of battery 12 with respect to the chassis ground to determine the insulation resistance (Ribat) of battery 12. In one more specific embodiment, the processing circuitry 18 determines the parallel equivalent resistance of the positive and negative terminals according to Equation 3:

$$\text{Ribat}=(\text{Ripos}\times\text{Rineg})/(\text{Ripos}+\text{Rineg}) \quad \text{Equation 3}$$

The processing circuitry 18 may monitor one or more of the values of Ripos, Rineg and/or Ribat with respect to respective thresholds and take appropriate action if any of the values of Ripos, Rineg and/or Ribat trigger a respective threshold indicating that the insulation resistance has fallen below the respective threshold. For example, the processing circuitry 18 may initiate an alarm that an insulation failure has occurred or perhaps a shutdown command. Depending upon the thresholds tripped, different alarms may be generated to indicate perhaps lack of performance due to the falling insulation resistance and/or vehicle safety in some examples.

In one embodiment, the processing circuitry 18 may monitor the insulation resistances at different moments in time depending upon the application of use of apparatus 11 or other factors. In one example embodiment where the battery 12 of vehicle 10 is being monitored, the processing circuitry 18 may monitor the insulation resistances when the vehicle is started after a period of non-use. In addition, the processing circuitry 18 may continue to monitor the insulation resistances at desired intervals after start-up and during use (e.g., every hour of use in one example).

As discussed below with respect to FIG. 4B, the measurement circuitry 26 includes operational amplifier resistances on the positive and negative terminals with respect to the chassis ground in one embodiment to provide signals having scaled down voltages which may be safely accessed by processing circuitry 18. These resistances are present during the introduction of the imbalanced resistances of circuitry 24 and the R0 resistance of circuitry 22 in one embodiment.

Referring to FIGS. 4A-4B, one example arrangement of monitoring circuitry 16 is shown. Other configurations are possible in other embodiments.

In the illustrated embodiment, known resistance circuitry 22 includes two series resistance strings which may be selectively enabled and disabled by control signals IMCTL1 and IMCTL0 from processing circuitry 18. The two series resistance strings each provide the known resistance R0 of 678 kOhms (3×226 kOhms) intermediate respective ones of the positive or negative terminals (i.e., Stack +, −) and the chassis ground.

The illustrated imbalance circuitry 24 includes two series resistance strings which may be selectively simultaneously enabled by a control signal INSU_SW_EN from processing circuitry 18. In the illustrated embodiment when enabled, the imbalance circuitry 24 circuitry couples an imbalance resistance of 3 MOhms intermediate the positive terminal and the chassis ground while coupling an imbalance resistance of 2.499 MOhms intermediate the negative terminal and the chassis ground. With the forced imbalance, V'1 will always be higher than V1 if the insulation resistances of the positive and negative terminals are balanced. However, V1 can be greater than V'1 if the insulation resistance from the positive terminal to chassis ground is significantly lower than the insulation resistance of the negative terminal to the chassis ground.

The illustrated measurement circuitry 26 includes two operational amplifier resistances of 15.39 MOhms and 15.33 MOhms which are in parallel with the imbalanced resistance strings of imbalance circuitry 24. These resistances may be considered for insulation resistance measurements in one embodiment as described below. The scaled outputs INV1/STACK+ and INV2/STACK− may be provided to processing circuitry 18 for calculating the above-described voltages of the positive and negative terminals in one embodiment.

Equations 1 and 2 may be modified to account for the operational amplifier resistances of ROpAmpPos and ROpAmpNeg in the measurement circuitry 26 of the arrangement of FIGS. 4A and 4B as shown below in respective Equations 4 and 5:

$$\text{Ripos} = -[R0 \times \text{ROpAmpPos} \times (V\text{bat} - V\text{neg} - V\text{pos})] / [R0 \times (V\text{bat} - V\text{neg} - V\text{pos}) + \text{ROpAmpPos} \times (V\text{bat} - V\text{pos})] \quad \text{Equation 4}$$

$$\text{Rineg} = -[R0 \times \text{ROpAmpNeg} \times (V\text{bat} - V\text{neg} - V\text{pos})] / [R0 \times (V\text{bat} - V\text{neg} - V\text{pos}) + \text{ROpAmpNeg} \times (V\text{bat} - V\text{neg})] \quad \text{Equation 5}$$

The parallel equivalent resistance of the battery 12 may be determined using Equations 3, 4 and 5 for the example embodiment of FIGS. 4A-4B in one embodiment.

Figure 5:
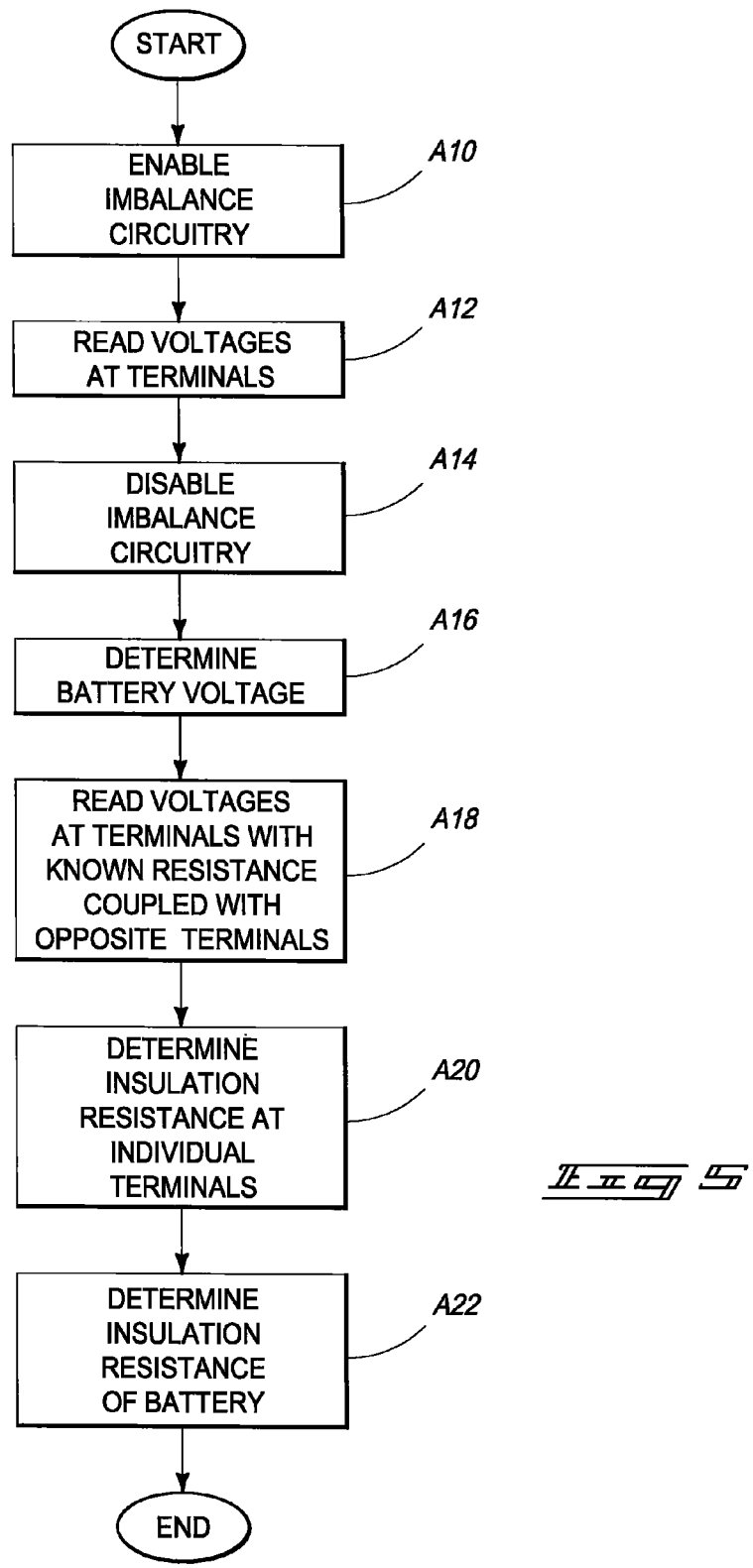
FIG. 5 is a flow chart of a method of measuring insulation resistance according to one embodiment.

Referring to FIG. 5, one method of measuring insulation resistances of the battery with respect to chassis ground of a vehicle is shown. The method may be performed by processing circuitry 18 in one embodiment. Other methods are possible including more, fewer and/or alternative acts.

At an act A10, the processing circuitry may enable the imbalance circuitry to introduce the imbalanced resistances to respective ones of the positive and negative terminals. In the example of FIGS. 4A and 4B, the processing circuitry may output a high signal on INSU_SW_EN in act A10. In other embodiments, imbalance resistances are not used or are not present as mentioned above.

At an act A12, the processor accesses the voltages at the positive and negative battery terminals to determine V'1 and V1 with the imbalanced resistances coupled with the positive and negative battery terminals. In one embodiment for FIGS. 4A and 4B, the processing circuitry determines V'1 by accessing the voltage at IMV1/STACK+ and dividing the voltage by 0.0039245244 and determines V1 by accessing the voltage at IMV2/STACK− and dividing the voltage by 0.003939987.

At an act A14, the processing circuitry disables the imbalance circuitry. In the arrangement of FIGS. 4A and 4B, the processing circuitry may output low on INSU_SW_EN.

At an act A16, the processing circuitry accesses the battery voltage Vbat by determining the battery voltage through a summation of V'1 and V1 in one embodiment.

At an act A18, the processing circuitry enables the known resistance circuitry to couple the known resistance R0 with the positive terminal and chassis ground and the negative terminal and chassis ground at different moments in time to measure Vpos and Vneg with respect to chassis ground. In the embodiment of FIGS. 4A and 4B, the processing circuitry may output a high signal on IMCTL0 to couple R0 with the negative terminal, wait for a period of time and thereafter access the voltage of IMV1/VSTACK+ and divide the voltage by 0.0039245244 to determine the voltage at the positive terminal (Vpos). Thereafter, the processing circuitry may output a low signal on IMCTL0. The processing circuitry may determine Vneg by outputting a high signal on IMCTL0 to couple R0 with the positive terminal, wait for a period of time and thereafter access a voltage on IMV2/VSTACK− and divide the voltage by 0.003939987 to determine the voltage of the negative terminal (Vneg). Thereafter, the processing circuitry may output a low signal on IMCTL1.

At an Act A20, the processing circuitry may determine the insulation resistances of the positive and negative terminals by Equations 1, 2, 4, or 5 as appropriate.

An Act A22, the processing circuitry may determine the insulation resistance of the battery. In one embodiment, the processing circuitry may use Equation 3 to determine the insulation resistance of the battery. As described above in one example, the insulation resistance of the battery is the parallel equivalent resistance of the insulation resistances of the positive and negative terminals with respect to the ground reference.

The above-described equations and methods for determining insulation resistances of the terminals and battery 12 provide increased accuracy compared to the above-described conventional method with the additional utility of not having the above-described requirements (e.g., impedance value requirements of the internal resistance of the voltmeter and known resistance) associated with the conventional method. In addition, some aspects of disclosure provide insulation resistance measurements of individual ones of the positive and negative terminals of the battery with respect to chassis ground in addition to an insulation resistance of the battery 12 itself. Knowledge of the insulation resistances of each of the positive and negative terminals with respect to ground may be useful in troubleshooting, for example, to determine a location of current leakage. Furthermore, the methods and apparatus of the disclosure provides increased accuracy with reduced mathematical error compared with the conventional method described above.

As discussed above, although the application is discussed with respect to determination of insulation resistances of a battery in an electrical vehicle application, methods and apparatus of the present disclosure are applicable to other arrangements where it is desired to determine insulation resistances.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include fewer, more and/or alternative features than those described in the illustrative embodiments. In more specific examples, Applicants consider the disclosure to include, disclose and describe methods which include fewer, more and/or alternative steps than those methods explicitly disclosed as well as apparatus which includes fewer, more and/or alternative structure than the explicitly disclosed structure.

What is claimed is:

1. An insulation resistance measurement apparatus comprising:
    processing circuitry configured to access a voltage of a battery with respect to a ground reference, to access a voltage of a first terminal of the battery with respect to the ground reference, to access a voltage of a second terminal of the battery with respect to the ground reference, and to determine an insulation resistance of the first terminal with respect to the ground reference using the voltage of the battery with respect to the ground reference, the voltage of the first terminal of the battery with respect to the ground reference, and the voltage of the second terminal of the battery with respect to the ground reference.

2. The apparatus of claim 1 wherein the processing circuitry is configured to determine an insulation resistance of the second terminal with respect to the ground reference.

3. The apparatus of claim 2 wherein the processing circuitry is configured to determine an insulation resistance of the battery with respect to the ground reference using the insulation resistances of the first and second terminals.

4. The apparatus of claim 3 wherein the processing circuitry is configured to determine the insulation resistance of the battery comprising the parallel equivalent resistance of the insulation resistances of the first and second terminals.

5. The apparatus of claim 1 wherein the processing circuitry is configured to access the voltage of the first terminal with a known resistance coupled with the second terminal and the ground reference and to access the voltage of the second terminal with a known resistance coupled with the first terminal and the ground reference.

6. The apparatus of claim 5 wherein the processing circuitry is configured to use the known resistance to determine the insulation resistance.

7. The apparatus of claim 1 further comprising known resistance circuitry configured to couple a known resistance with the first terminal during the accessing of the voltage of the second terminal and to couple a known resistance with the second terminal during the accessing of the voltage of the first terminal.

8. A battery insulation resistance measurement method performed using circuitry of an insulation resistance measurement apparatus, the method comprising:
    determining a first voltage of a first terminal of a battery;
    determining a first voltage of a second terminal of the battery;
    determining a voltage of the battery using the first voltages of the first and second terminals;
    determining a second voltage of the first terminal with a resistance coupled with the second terminal;
    determining a second voltage of the second terminal with a resistance coupled with the first terminal;
    determining, using the insulation resistance measurement apparatus, an insulation resistance of the battery using the voltage of the battery and the second voltages of the first and second terminals;
    de-coupling the resistance from the second terminal after the determining the second voltage of the first terminal;
    de-coupling the resistance from the first terminal after the determining the second voltage of the second terminal;
    wherein the determining the second voltage of the first terminal comprises determining with the resistance de-coupled from the first terminal and the determining the second voltage of the second terminal comprises determining with the resistance de-coupled from the second terminal;
    monitoring the insulation resistance of the battery with respect to a threshold; and
    initiating an alarm as a result of the monitoring.

9. The method of claim 8 wherein the determining the voltage of the battery comprises summing the first voltages of the first and second terminals after the determining the first voltages of the first and second terminals.

10. The method of claim 8 wherein the determining the insulation resistance comprises determining the insulation resistance for at least one of the first and the second terminals.

11. The method of claim 8 wherein the determining the insulation resistance comprises determining the insulation resistance for both of the first and the second terminals.

12. The method of claim 8 wherein the determining the insulation resistance comprises determining the insulation resistance of the battery using the insulation resistances of the first and second terminals.

13. The method of claim 8 wherein the determinings of the first voltages of the first and second terminals individually comprise determining without the resistance coupled with the other of the first and second terminals.

14. The method of claim 8 further comprising coupling different resistances with respective ones of the first and second terminals during the respective determinings of the first voltages of the first and second terminals, and de-coupling the different resistances from the first and second terminals after the determinings of the first voltages of the first and second terminals.

15. An insulation resistance measurement method performed using circuitry of an insulation resistance measurement apparatus, the method comprising:
- determining a voltage of a battery;
- measuring a voltage of a first terminal of the battery with a resistance coupled with a second terminal of the battery, the second terminal having an electrical polarity which is opposite to an electrical polarity of the first terminal;
- measuring a voltage of the second terminal of the battery with a resistance coupled with the first terminal of the battery;
- determining, using the insulation resistance measurement apparatus, an insulation resistance of one of the first and second terminals of the battery using the voltage of the battery, the voltage of the first terminal of the battery, and the voltage of the second terminal of the battery;
- monitoring the insulation resistance of the one of the first and second terminals of the battery with respect to a threshold; and
- initiating an alarm as a result of the monitoring.

16. The method of claim 15 further comprising determining an insulation resistance of another of the first and second terminals of the battery using the voltage of the battery, the voltage of the first terminal of the battery, and the voltage of the second terminal of the battery.

17. The method of claim 16 further comprising determining an insulation resistance of the battery using the insulation resistances of the first and second terminals.

18. A battery insulation resistance measurement method performed using circuitry of an insulation resistance measurement apparatus, the method comprising:
- determining a first voltage of a first terminal of a battery;
- determining a first voltage of a second terminal of the battery;
- determining a voltage of the battery using the first voltages of the first and second terminals;
- determining a second voltage of the first terminal with a resistance coupled with the second terminal;
- determining a second voltage of the second terminal with a resistance coupled with the first terminal;
- determining, using the insulation resistance measurement apparatus, an insulation resistance of the battery using the voltage of the battery and the second voltages of the first and second terminals;
- coupling different resistances with respective ones of the first and second terminals during the respective determinings of the first voltages of the first and second terminals, and de-coupling the different resistances from the first and second terminals after the determinings of the first voltages of the first and second terminals;
- monitoring the insulation resistance of the battery with respect to a threshold; and
- initiating an alarm as a result of the monitoring.

* * * * *